(12) United States Patent
Choi

(10) Patent No.: US 11,423,992 B2
(45) Date of Patent: Aug. 23, 2022

(54) PAGE BUFFER AND SEMICONDUCTOR MEMORY DEVICE HAVING THE PAGE BUFFER

(71) Applicant: SK hynix Inc., Icheon-si (KR)

(72) Inventor: Hyung Jin Choi, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/172,730

(22) Filed: Feb. 10, 2021

(65) Prior Publication Data
US 2022/0044734 A1 Feb. 10, 2022

(30) Foreign Application Priority Data
Aug. 6, 2020 (KR) .................. 10-2020-0098786

(51) Int. Cl.
*G11C 7/00* (2006.01)
*G11C 16/24* (2006.01)
*G11C 16/26* (2006.01)
*G11C 16/04* (2006.01)

(52) U.S. Cl.
CPC .............. *G11C 16/24* (2013.01); *G11C 16/26* (2013.01); *G11C 16/0483* (2013.01)

(58) Field of Classification Search
CPC ....... G11C 7/1051; G11C 7/1078; G11C 7/22; G11C 7/106; G11C 7/1054
USPC ............................................ 365/189.05, 203
See application file for complete search history.

(56) References Cited

U.S. PATENT DOCUMENTS 10,339,989 B2* 7/2019 Kim ..................... G11C 7/12
2009/0161444 A1* 6/2009 Park ..................... G11C 16/10
365/189.05

FOREIGN PATENT DOCUMENTS

KR 1020170098716 A 8/2017

* cited by examiner

*Primary Examiner* — Son T Dinh
(74) *Attorney, Agent, or Firm* — William Park & Associates Ltd.

(57) ABSTRACT

The present technology relates to a page buffer and a semiconductor memory device including the page buffer. The page buffer includes a sensing node, a bit line controller connected between the sensing node and a bit line. The bit line controller is configured to first precharge and second precharge the sensing node.

21 Claims, 10 Drawing Sheets

PAGE BUFFER AND SEMICONDUCTOR MEMORY DEVICE HAVING THE PAGE BUFFER

CROSS-REFERENCE TO RELATED APPLICATION

The present application claims priority under 35 U.S.C. § 119(a) to Korean patent application number 10-2020-0098786 filed on Aug. 6, 2020, in the Korean Intellectual Property Office, the entire disclosure of which is incorporated by reference herein.

BACKGROUND

1. Technical Field

The present disclosure relates to an electronic device, and more particularly, to a page buffer and a semiconductor memory device including the page buffer.

2. Related Art

A semiconductor memory device is a memory device that is implemented using a semiconductor such as silicon (Si), germanium (Ge), gallium arsenide (GaAs), or indium phosphide (InP). The semiconductor memory device is largely classified into a volatile memory device and a non-volatile memory device.

The volatile memory device is a memory device in which stored data is lost when power supply is cut off. The volatile memory device includes a static RAM (SRAM), a dynamic RAM (DRAM), a synchronous DRAM (SDRAM), and the like. The non-volatile memory device is a memory device that maintains stored data even though power supply is cut off. The non-volatile memory device includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is largely divided into a NOR type and a NAND type.

SUMMARY

A page buffer according to an embodiment of the present disclosure may include a sensing node, a bit line controller connected between the sensing node and a bit line, and configured to, during a sensing node precharge operation, perform a first precharge of the sensing node to precharge the sensing node to a first potential level and then perform a second precharge of the sensing node to a second potential level. The page buffer may include a sub latch for latching sensing data based on a potential level of the sensing node.

A semiconductor memory device according to an embodiment of the present disclosure may include a memory cell array, and a plurality of page buffers connected to a plurality of bit lines of the memory cell array, respectively. Each of the plurality of page buffers includes a sensing node, a bit line controller connected between the sensing node and a bit line, and configured to, during a sensing node precharge operation, perform a first precharge of the sensing node to precharge the sensing node to a first potential level and then perform a second precharge of the sensing node to increase a potential level of the sensing node to a second potential level. The page buffers may include a sub latch for latching sensing data based on a potential level of the sensing node.

A page buffer according to an embodiment of the present disclosure may include a sensing node, a bit line controller connected between the sensing node and a bit line, and configured to, during a sensing node precharge operation, precharge the sensing node to a first potential level using a first current path, and, after the sensing node has been precharged to the first potential level using the first current path, precharging the sensing node to a second potential level using a second current path, and a sub latch for latching sensing data based on a potential level of the sensing node.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and the descriptions are not limited to the embodiments described in the present specification or application.

Hereinafter, embodiments of the present disclosure will be described with reference to the accompanying drawings, so that those skilled in the art to which the present disclosure pertains may easily carry out the technical spirit of the present disclosure.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

An embodiment of the present disclosure provides a page buffer capable of improving operation performance and a semiconductor memory device including the same.

According to the present technology, a drop phenomenon of a power voltage may be improved by precharging the sensing node using a plurality of precharge current paths during a precharge operation of the sensing node.

Figure 1:
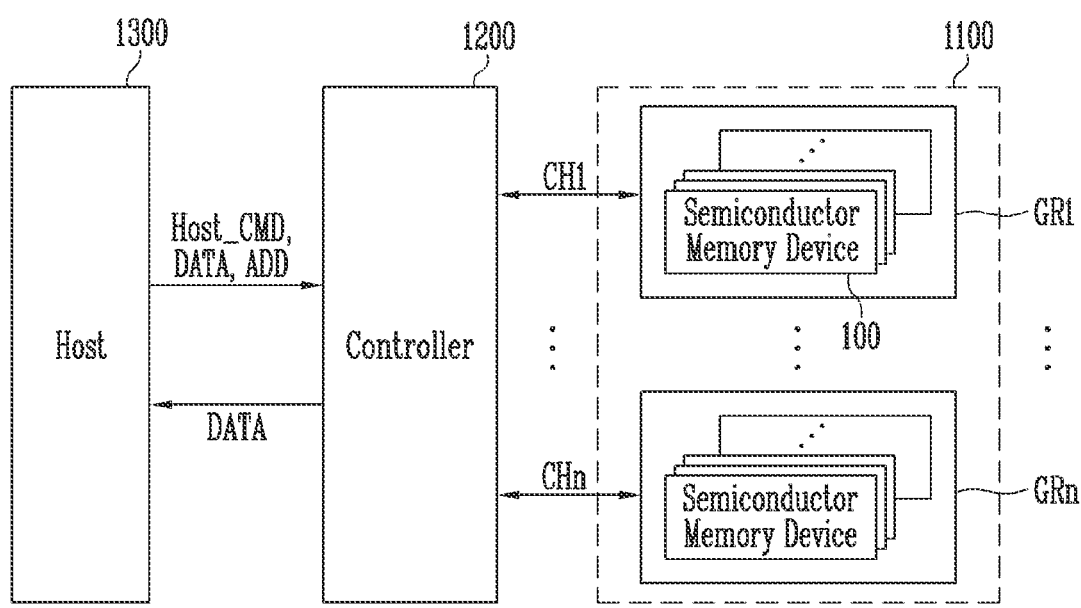
FIG. 1 is a block diagram illustrating a memory system including a memory device according to an embodiment of the present disclosure.

FIG. 1 is a block diagram illustrating a memory system including a memory device according to an embodiment of the present disclosure.

Referring to FIG. 1, the memory system 1000 includes a memory device 1100, a controller 1200, and a host 1300. The memory device 1100 includes a plurality of semiconductor memory devices 100. The plurality of semiconductor memory devices 100 may be divided into a plurality of groups GR1 to GRn. Although the host 1300 is illustrated and described as being included in the memory system 1000 in the embodiment of the present disclosure, the memory system 1000 may be configured to include only the controller 1200 and the memory device 1100, and the host may be configured to be disposed outside the memory system 1000.

In FIG. 1, the plurality of groups GR1 to GRn of the memory device 1100 communicate with the controller 1200 through first to n-th channels CH1 to CHn, respectively. Each semiconductor memory device 100 will be described later with reference to FIG. 2.

Each of the groups GR1 to GRn is configured to communicate with the controller 1200 through one common channel. The controller 1200 is configured to control the plurality of semiconductor memory devices 100 of the memory device 1100 through the plurality of channels CH1 to CHn.

The controller 1200 is connected between the host 1300 and the memory device 1100. The controller 1200 is configured to access the memory device 1100 in response to a request from the host 1300. For example, the controller 1200 is configured to control read, program, erase, and background operations of the memory device 1100 in response to a host command Host_CMD received from the host 1300. During the program operation, the host 1300 may transmit an address ADD and data DATA to be programmed together with the host command Host_CMD, and during the read operation, the host 1300 may transmit the address ADD together with the host command Host_CMD. During the program operation, the controller 1200 transmits a command corresponding to the program operation and the data DATA to be programmed to the memory device 1100. During the read operation, the controller 1200 transmits a command corresponding to the read operation to the memory device 1100, receives the read data DATA from the memory device 1100, and transmits the received data DATA to the host 1300. The controller 1200 is configured to provide an interface between the memory device 1100 and the host 1300. The controller 1200 is configured to drive firmware for controlling the memory device 1100.

The host 1300 includes a portable electronic device such as a computer, a PDA, a PMP, an MP3 player, a camera, a camcorder, or a mobile phone. The host 1300 may request a program operation, a read operation, an erase operation, or the like of the memory system 1000 through the host command Host_CMD. The host 1300 may transmit the host command Host_CMD, the data DATA, and the address ADD corresponding to the program operation to the controller 1200 for the program operation of the memory device 1100 and may transmit the host command Host_CMD and the address ADD corresponding to the read operation for the read operation to the controller 1200. At this time, the address ADD may be a logical address (logical address block) of data.

The controller 1200 and the memory device 1100 may be integrated into one semiconductor memory device. As an example of embodiment, the controller 1200 and the memory device 1100 may be integrated into a one semiconductor memory device to configure a memory card. For example, the controller 1200 and the memory device 1100 may be integrated into a one semiconductor memory device to configure a memory card such as a PC card (personal computer memory card international association (PCM-CIA)), a compact flash card (CF), a smart media card (SM or SMC), a memory stick, a multimedia card (MMC, RS-MMC, or MMCmicro), an SD card (SD, miniSD, microSD, or SDHC), and a universal flash stage device (UFS).

As another example, the memory system 1000 is provided as one of various components of an electronic device such as a computer, an ultra-mobile PC (UMPC), a workstation, a net-book, a personal digital assistants (PDA), a portable computer, a web tablet, a wireless phone, a mobile phone, a smart phone, an e-book, a portable multimedia player (PMP), a portable game machine, a navigation device, a black box, a digital camera, a 3-dimensional television, a digital audio recorder, a digital audio player, a digital picture recorder, a digital picture player, a digital video recorder, a digital video player, a device capable of transmitting and receiving information in a wireless environment, one of various electronic devices configuring a home network, one of various electronic devices configuring a computer network, one of various electronic devices configuring a telematics network, an RFID device, or one of various components configuring a computing system.

As an example of an embodiment, the memory device 1100 or memory system 1000 may be mounted as a package of various types. For example, the memory device 1100 or the memory system 1000 may be packaged and mounted in a method such as a package on package (PoP), ball grid arrays (BGAs), chip scale packages (CSPs), plastic leaded chip carriers (PLCC), a plastic dual in line package (PDIP), a die in waffle pack, die in wafer form, a chip on board (COB), a ceramic dual in line package (CERDIP), a plastic metric quad flat pack (MQFP), a thin quad flat pack (TQFP), a small outline (SOIC), a shrink small outline package (SSOP), a thin small outline (TSOP), a system in package (SIP), a multi-chip package (MCP), a wafer-level fabricated package (WFP), or a wafer-level processed stack package (WSP).

Figure 2:
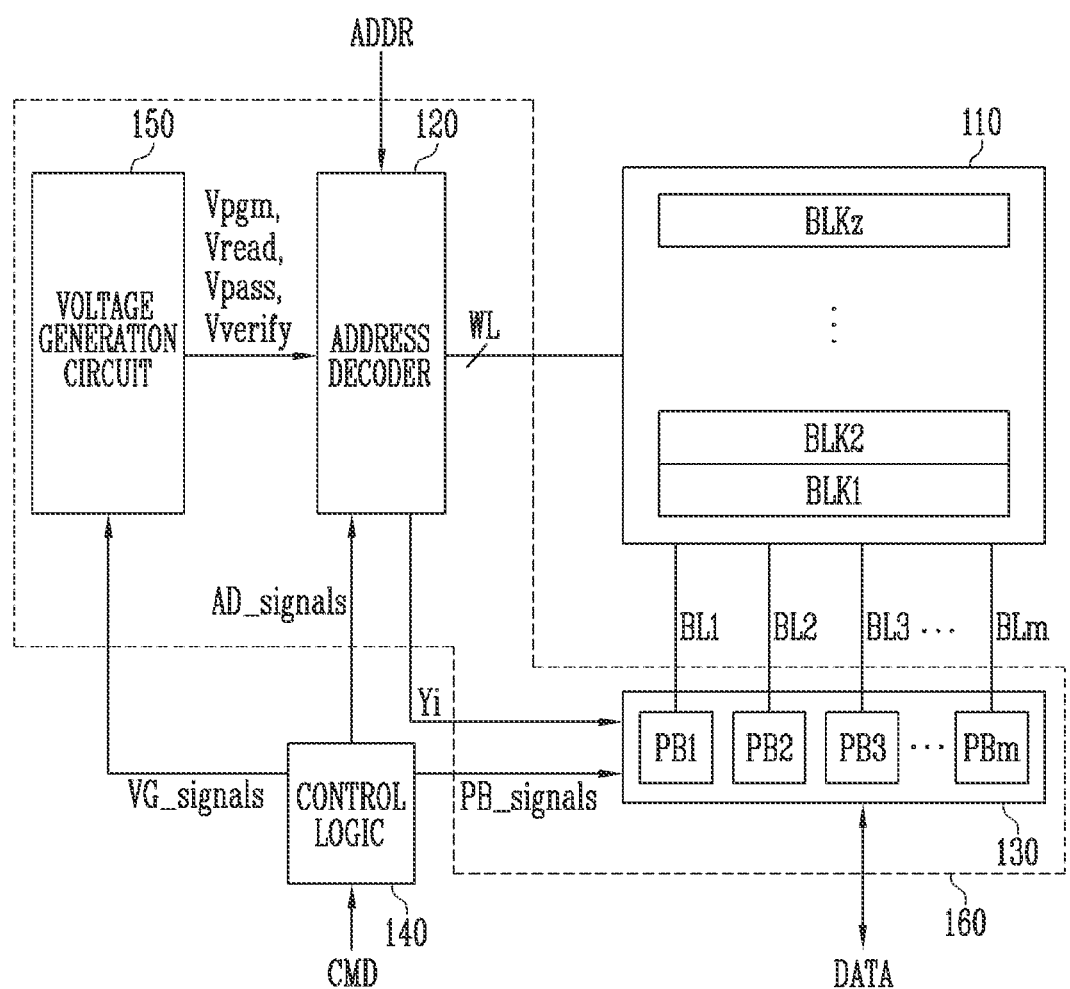
FIG. 2 is a diagram illustrating a semiconductor memory device included in the memory device of FIG. 1.

FIG. 2 is a diagram illustrating the semiconductor memory device included in the memory device of FIG. 1.

Referring to FIG. 2, the semiconductor memory device 100 includes a memory cell array 110, an address decoder 120, a read and write circuit 130, control logic 140, and a voltage generation circuit 150. The address decoder 120, the read and write circuit 130, and the voltage generation circuit 150 may be defined as a peripheral circuit 160 that performs a read operation on the memory cell array 110. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read and write circuit 130 through bit lines BL1 to BLm. Each of the plurality of memory blocks BLK1 to BLKz includes a plurality of memory cells. As an embodiment, the plurality of memory cells are non-volatile memory cells. A plurality of memory cells connected to one word line among the plurality of memory cells may be defined as one page. That is, the memory cell array 110 may be configured of a plurality of pages.

Each of the plurality of memory blocks BLK1 to BLKz of the memory cell array 110 includes a plurality of memory strings. Each of the plurality of memory strings includes a drain select transistor connected in series between a bit line and a source line, a plurality of memory cells, and a source select transistor. In addition, each of the plurality of memory strings may include a pass transistor between the source select transistor and the memory cells, and between the drain select transistor and the memory cells, and may further include a pipe gate transistor between the memory cells. Detailed description of the memory cell array 110 will be described later.

The address decoder 120 is connected to the memory cell array 110 through the word lines WL. The address decoder 120 is configured to operate in response to address decoder control signals AD_signals generated in the control logic 140. The address decoder 120 receives an address ADDR through an input/output buffer (not shown) inside the memory device 100.

During the program operation, the address decoder 120 may decode a row address of the received address ADDR and may apply a plurality of operation voltages including a program voltage Vpgm, a read voltage Vread, a pass voltage Vpass, and a verify voltage Vverify generated by the voltage generation circuit 150 to the plurality of memory cells of the memory cell array 110 according to the decoded row address.

The address decoder 120 is configured to decode a column address of the received address ADDR. The address decoder 120 transmits a decoded column address Yi to the read and write circuit 130.

The address ADDR received during the program operation or the read operation includes a block address, the row address, and the column address. The address decoder 120 selects one memory block and one word line according to the block address and the row address. The column address is decoded by the address decoder 120 and provided to the read and write circuit 130.

The address decoder 120 may include a block decoder, a row decoder, a column decoder, an address buffer, and the like.

The read and write circuit 130 includes a plurality of page buffers PB1 to PBm. The plurality of page buffers PB1 to PBm are connected to the memory cell array 110 through the bit lines BL1 to BLm. During the read operation or the verify operation, the plurality of page buffers PB1 to PBm may perform a sensing operation of sensing a program state of the memory cells connected to the bit lines BL1 to BLm. During the sensing operation, each of the plurality of page buffers PB1 to PBm may precharge a sensing node in the page buffer, control a potential level of the sensing node based on a current amount of corresponding bit lines BL1 to BLm, and then latch data corresponding to the potential level of the sensing node. In addition, the plurality of page buffers PB1 to PBm may receive and temporarily store data to be programmed during the program operation, and adjust potential levels of corresponding bit lines BL1 to BLm based on the temporarily stored data.

The page buffer according to an embodiment of the present disclosure may first precharge the sensing node to a first potential level using a first current path and then second precharge the sensing node to a second potential level higher than the first potential level using first and second current paths during a sensing node precharge operation of precharging the sensing node to a predetermined level. Accordingly, a phenomenon in which a core voltage is dropped during the sensing node precharge operation of simultaneously precharging the sensing nodes of the plurality of page buffers PB1 to PBm. The word "predetermined" as used herein with respect to a parameter, such as a predetermined level, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The read and write circuit 130 operates in response to page buffer control signals PB_signals output from the control logic 140.

The control logic 140 is connected to the address decoder 120, the read and write circuit 130, and the voltage generation circuit 150. The control logic 140 receives a command CMD through the input/output buffer (not shown) of the semiconductor memory device 100. The control logic 140 is configured to control an overall operation of the semiconductor memory device 100 in response to the command CMD. For example, the control logic 140 receives the command CMD corresponding to the program operation, and generates and outputs the address decoder control signals AD_signals for controlling the address decoder 120, the page buffer control signals PB_signals for controlling the read and write circuit 130, and voltage generation circuit control signals VG_signals for controlling the voltage generation circuit 150, in response to the received command CMD. In addition, the control logic 140 receives the command CMD corresponding to the read operation, and generates and outputs the address decoder control signals AD_signals for controlling the address decoder 120, the page buffer control signals PB_signals for controlling the read and write circuit 130, and the voltage generation circuit control signals VG_signals for controlling the voltage generation circuit 150, in response to the received command CMD.

During the program operation, the voltage generation circuit 150 generates the program voltage Vpgm, the pass voltage Vpass, and the verify voltage Vverify according to control of the voltage generation circuit control signals VG_signals output from the control logic 140, and outputs the program voltage Vpgm, the pass voltage Vpass, and the verify voltage Vverify to the address decoder 120. In addition, during the read operation, the voltage generation circuit 150 generates the read voltage Vread and the pass voltage Vpass according to control of the voltage generation circuit control signals VG_signals output from the control logic 140, and outputs the read voltage Vread and the pass voltage Vpass to the address decoder 120.

Figure 3:
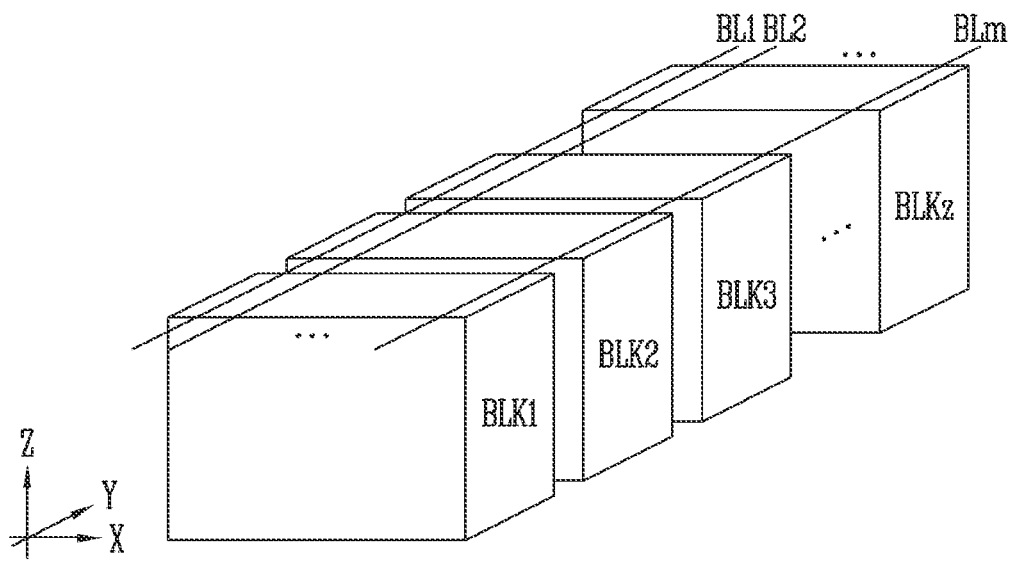
FIG. 3 is a diagram illustrating three-dimensional memory blocks.

FIG. 3 is a diagram illustrating three-dimensional memory blocks.

Referring to FIG. 3, the three-dimensional memory blocks BLK1 to BLKz may be arranged to be spaced apart from each other along a direction Y in which the bit lines BL1 to BLM are extended. For example, first to z-th memory blocks BLK1 to BLKz may be arranged to be spaced apart from each other along a second direction Y, and include a plurality of memory cells stacked along a third direction Z. A configuration of any one of the first to z-th memory blocks BLK1 to BLKz will be described below with reference to FIGS. 4 and 5.

Figure 4:
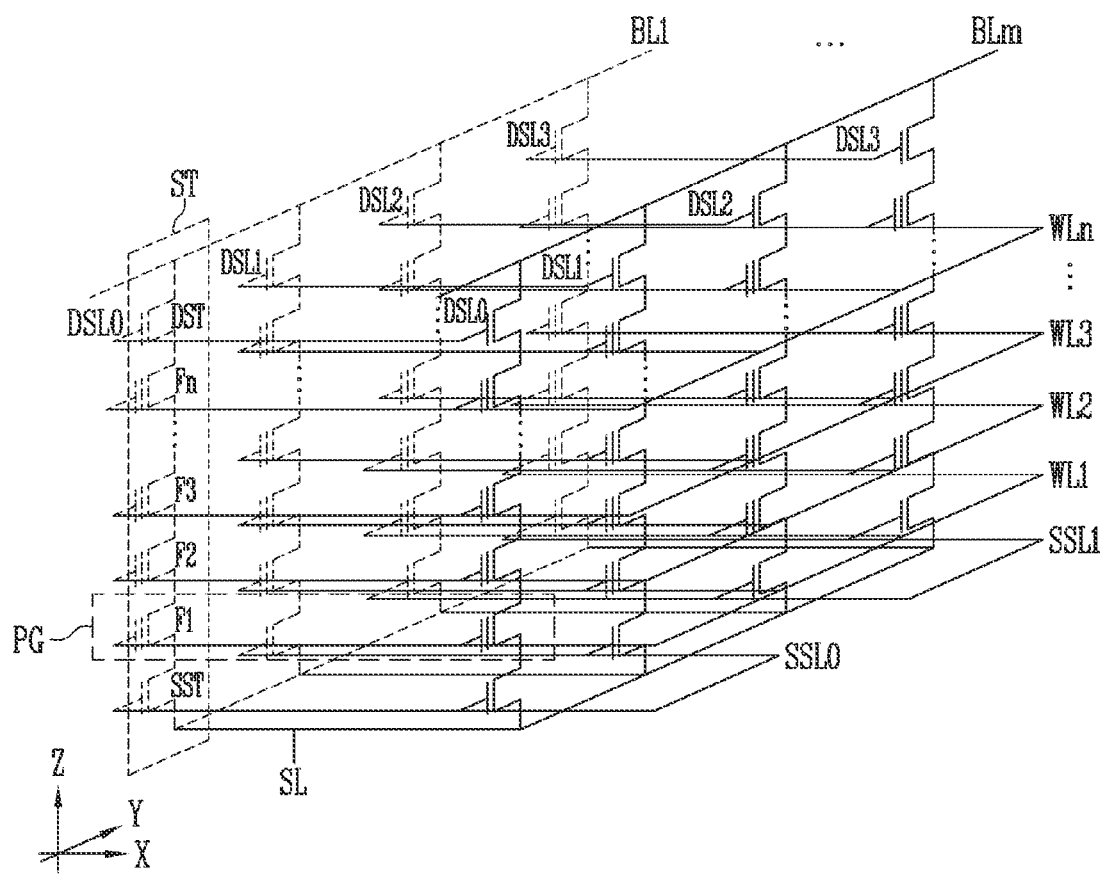
FIG. 4 is a circuit diagram for describing one of the memory blocks shown in FIG. 3.

FIG. 4 is a circuit diagram for describing one of the memory blocks shown in FIG. 3.

Figure 5:
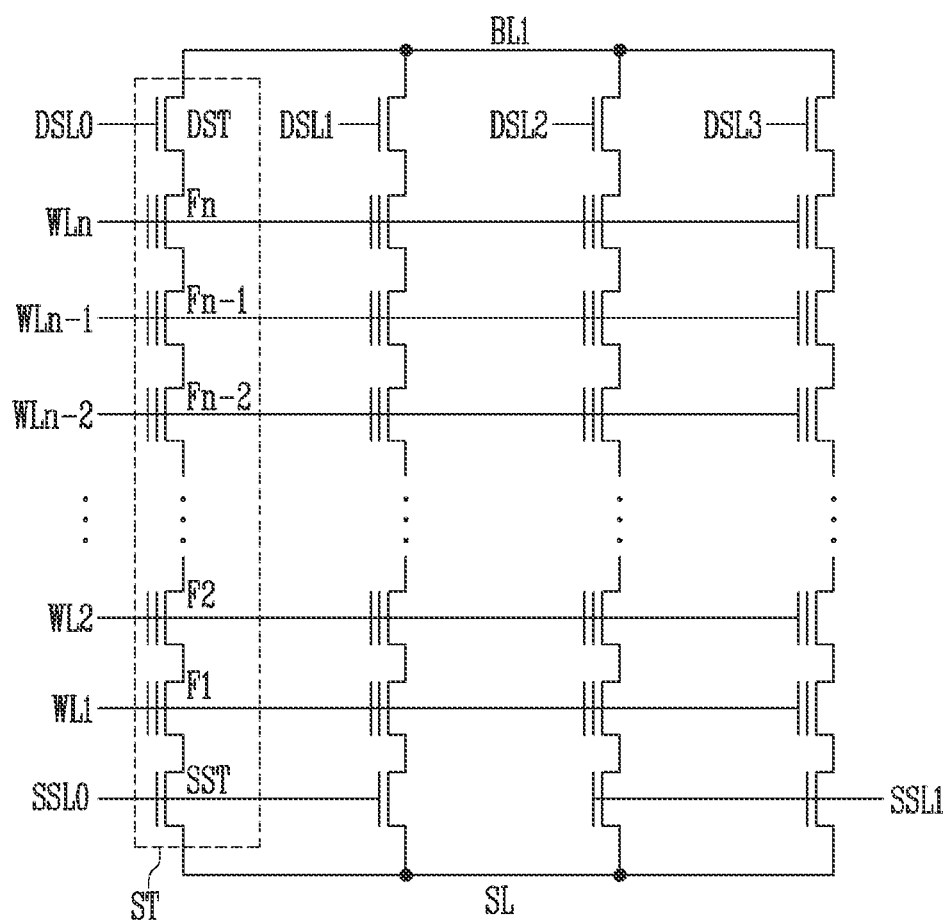
FIG. 5 is a circuit diagram illustrating memory strings shown in FIG. 4.

FIG. 5 is a circuit diagram illustrating memory strings shown in FIG. 4.

Referring to FIGS. 4 and 5, each memory string ST may be connected between the bit lines BL1 to BLm and a source line SL. The memory string ST connected between the first bit line BL1 and the source line SL will be described as an example.

The memory string ST may include source select transistors SST connected in series between the source line SL and the first bit line BL1, memory cells F1 to Fn (n is a positive integer), and a drain select transistor DST. Gates of the source select transistors SST included in different memory strings ST connected to different bit lines BL1 to BLm may be connected to a first source select line SSL0 and a second source select line SSL1. For example, source select transistors adjacent to each other in the second direction Y among the source select transistors SST may be connected to the same source select line. For example, assuming that the source select transistors SST are sequentially arranged along the second direction Y, the gates of the source select transistors SST arranged in the first direction X from a first source select transistor SST and included in different strings ST and the gates of the source select transistors SST arranged in the first direction X from a second source select transistor SST and included in different strings ST may be connected to the first source select line SSL0. In addition, the gates of the source select transistors SST arranged in the first direction X from a third source select transistor SST and included in different strings ST and the gates of the source select transistors SST arranged in the first direction X from a fourth source select transistor SST and included in different strings ST may be connected to the second source select line SSL1.

Gates of the memory cells F1 to Fn may be connected to the word lines WL1 to WLn, and gates of the drain select transistors DST may be connected to any one of first to fourth drain select lines DSL0 to DSL3.

Gates of transistors arranged in the first direction X among the drain select transistors DST may be commonly connected to the same drain select line (for example, DSL0), but transistors arranged in the second direction Y may be connected to different drain select lines DSL1 to DSL3. For example, assuming that the drain select transistors DST are sequentially arranged along the second direction Y, the gates of the drain select transistors DST arranged in the first direction X from a first drain select transistor DST and included in different strings ST may be connected to a first drain select line DSL0. The drain select transistors DST arranged in the second direction Y from the drain select transistors DST connected to the first drain select line DSL0 may be sequentially connected to second to fourth drain select lines DSL1 to DSL3. Therefore, the memory strings ST connected to a selected drain select line may be selected within a selected memory block, and memory strings ST connected to remaining unselected drain select lines may be unselected.

Memory cells connected to the same word line may form one page PG. Here, the page means a physical page. For example, among the strings ST connected to the first bit line BL1 to the m-th bit line BLm, a group of memory cells connected in the first direction X at the same word line is referred to as the page PG. For example, among the first memory cells F1 connected to the first word line WL1, memory cells arranged along the first direction X may form one page PG. Cells arranged in the second direction Y among the first memory cells F1 commonly connected to the first word line WL1 may be divided into different pages. Therefore, when the first drain select line DSL0 is the selected drain select line and the first word line WL1 is the selected word line, the page connected to the first drain select line DSL0 becomes a selected page among a plurality of pages PG connected to the first word line WL1. The pages which are commonly connected to the first word line WL1 but connected to the unselected second to fourth drain select lines DSL1 to DSL3 become unselected pages.

In the drawing, one source select transistor SST and one drain select transistor DST are included in one string ST, but a plurality of source select transistors SST and a plurality of drain select transistors DST may be included in one string ST according to the semiconductor memory device. In addition, dummy cells may be included between the source select transistor SST, the memory cells F1 to Fn, and the drain select transistor DST according to the memory device. The dummy cells may not store user data like normal memory cells F1 to Fn, but may be used to improve an electrical characteristic of each string ST. However, the dummy cells are not an important configuration in the present embodiment, and thus detailed description thereof is omitted.

Figure 6:
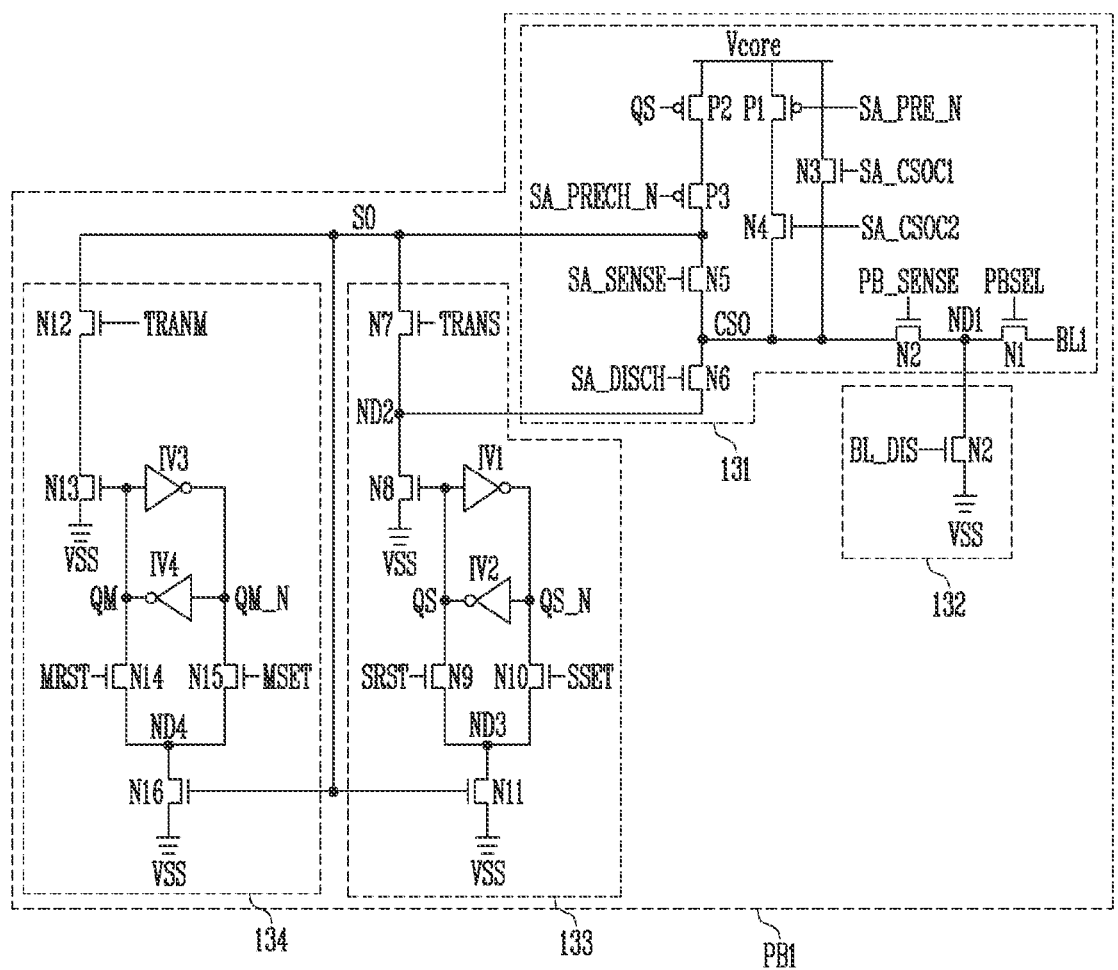
FIG. 6 is a circuit diagram illustrating a page buffer according to an embodiment of the present disclosure.

FIG. 6 is a circuit diagram illustrating the page buffer according to an embodiment of the present disclosure.

Referring to FIG. 6, the page buffer PB1 may include a bit line controller 131, a bit line discharger 132, a sub latch 133, and a main latch 134.

The bit line controller 131 precharges a sensing node SO to a setting level during a sensing node precharge operation in the read operation or the verify operation, and controls a potential level of the sensing node SO based on a current amount of the bit line BL1, which is changed according to a program state of the memory cell connected to the bit line BL1 during a sensing operation performed after the sensing node precharge operation.

The bit line controller 131 may include a plurality of NMOS transistors N1 to N6, and a plurality of PMOS transistors P1 to P3.

The NMOS transistor N1 is connected between the bit line BL1 and a node ND1, and electrically connects the bit line BL1 and the node ND1 in response to a page buffer select signal PBSEL.

The NMOS transistor N2 is connected between the node ND1 and a common sensing node CSO, and electrically connects the node ND1 and the common sensing node CSO in response to a page buffer sensing signal PB_SENSE.

The NMOS transistor N3 is connected between a core voltage Vcore and the common sensing node CSO, and applies the core voltage Vcore to the common sensing node CSO to precharge the common sensing node CSO in response to a first common sensing control signal SA_CSOC1. At this time, the common sensing node CSO is precharged to a potential level reduced from the core voltage Vcore by a threshold voltage of the NMOS transistor N3.

The PMOS transistor P1 and the NMOS transistor N4 are connected in series between the core voltage Vcore and the common sensing node CSO, the PMOS transistor P1 is turned on in response to a first precharge signal SA_PRE_N, and the NMOS transistor N4 is turned on in response to a second common sensing control signal SA_CSOC2. That is, the PMOS transistor P1 and the NMOS transistor N4 apply the core voltage Vcore to the common sensing node CSO in response to the first precharge signal SA_PRE_N and the second common sensing control signal SA_CSOC2, respectively.

The PMOS transistor P2 and the PMOS transistor P3 are connected in series between the core voltage Vcore and the sensing node SO, and are turned on in response to a node QS of the sub latch 133 and a second precharge signal SA_PRECH_N, respectively. That is, the PMOS transistor P2 and the PMOS transistor P3 apply the core voltage Vcore to the sensing node SO to precharge the sensing node SO to a second potential level in response to the node QS and the second precharge signal SA_PRECH_N, respectively. A current path formed from the core voltage Vcore to the sensing node SO through the PMOS transistor P2 and PMOS transistor P3 may be defined as a second current path. The second potential level may be higher than the first potential level, and the second potential level may be equal to a potential of the core voltage Vcore.

The NMOS transistor N5 is connected between the sensing node SO and the common sensing node CSO, and electrically connects the sensing node SO and the common sensing node CSO in response to a sensing signal SA_SENSE. For example, during the sensing node precharge operation, the NMOS transistor N5 electrically connects the common sensing node CSO and the sensing node SO in response to the sensing signal SA_SENSE to form a first current path. Accordingly, during the sensing node precharge operation, the sensing node SO is precharged to the first potential level. The first potential level being lower than the potential level of the common sensing node CSO by a threshold voltage of the NMOS transistor N5.

The NMOS transistor N6 is connected between the common sensing node CSO and a node ND2 of the sub latch 133, and electrically connects the common sensing node CSO and the node ND2 in response to a discharge signal SA_DISCH.

An operation of the bit line controller 131 during the sensing node precharge operation is described as follows.

The PMOS transistor P2 is turned on in response to the node QS set to a low logic level. The NMOS transistor N3 applies the core voltage Vcore to the common sensing node CSO in response to the first common sensing control signal SA_CSOC1 of a logic high level. The NMOS transistor N5 forms the first current path by electrically connecting the common sensing node CSO and the sensing node SO in response to the sensing signal SA_SENSE. Accordingly, the sensing node SO is precharged to the first potential level. The first potential level may be a potential level obtained by subtracting the threshold voltage of the NMOS transistor N3 and the threshold voltage of the NMOS transistor N5 from the core voltage Vcore.

Thereafter, after a set time, the PMOS transistor P3 is turned on in response to the second precharge signal SA_PRECH_N. Accordingly, the second current path connected to the sensing node SO through the PMOS transistor P2 and PMOS transistor P3 from the core voltage Vcore is formed, and the sensing node SO is precharged to the second potential level higher than the first potential level. That is, the sensing node SO is precharged to the potential of the core voltage Vcore.

After the sensing node precharge operation, the sensing operation may be performed. An operation of the bit line controller 131 during the sensing operation is described as follows.

An evaluation operation is performed from a time point when the second precharge signal SA_PRECH_N is transited from a logic low level to a logic high level to a time point when the sensing signal SA_SENSE is transited to a logic low level. The PMOS transistor P3 is turned off in response to the second precharge signal SA_PRECH_N transited to the logic high level, and the core voltage Vcore applied to the sensing node SO is cut off. A potential level of the sensing node SO and the common sensing node CSO change according to the program state of the memory cell connected to the bit line BL1. For example, in a case of a program state in which a threshold voltage of the memory cell is greater than the read voltage or the verify voltage applied to the word line of the memory cell during the read or verify operation, a current does not flow through the bit line BL1. Accordingly, the potentials of the common sensing node CSO and the sensing node SO maintain the second potential level. On the other hand, in a case of an erase state in which the threshold voltage of the memory cell is less than the read voltage or the verify voltage applied to the word line of the memory cell during the read or verify operation, a current flows through the bit line BL1. Accordingly, the potentials of the common sensing node CSO and the sensing node SO decrease from the second potential level by a discharge level. That is, during the sensing operation, the potential level of the sensing node SO maintains the second potential level which is a precharged state or is decreased to the discharge level according to the threshold voltage of the memory cell connected to the bit line BL1.

The bit line discharger 132 is connected to the node ND1 of the bit line controller 131 to discharge a potential level of the bit line BL1.

The bit line discharger 132 may include an NMOS transistor N21 connected between the node ND1 and ground power VSS, and the NMOS transistor N21 applies the ground power VSS to the node ND1 in response to a bit line discharge signal BL_DIS.

The sub latch 133 may include a plurality of NMOS transistors N7 to N11 and inverters IV1 and IV2.

The inverters IV1 and IV2 may be connected in parallel in a reverse direction between a node QS and a node QS_N to configure a latch.

The NMOS transistor N7 and the NMOS transistor N8 are connected in series between the sensing node SO and the ground power VSS, the NMOS transistor N7 is turned on in response to the transmission signal TRANSS, and the NMOS transistor N8 is turned on or off according to a potential level of the node QS.

The NMOS transistor N9 is connected between the node QS and a node ND3, and electrically connects the node QS and the node ND3 in response to a reset signal SRST. The NMOS transistor N10 is connected between the node QS_N and the node ND3, and electrically connects the node QS_N and the node ND3 in response to a set signal SSET. The NMOS transistor N11 is connected between the node ND3 and the ground power VSS, and is turned on according to the potential of the sensing node SO to electrically connect the node ND3 and the ground power VSS. For example, in a state in which the sensing node SO is precharged to a high level, when the reset signal SRST is applied to the NMOS transistor N9 at a logic high level, the node QS and the node QS_N are initialized to a logic low level and a logic high level, respectively. In addition, in a state in which the sensing node SO is precharged to a high level, when the set signal SSET is applied to the NMOS transistor N10 at a logic high level, the node QS and the node QS_N are set to a logic high level and a logic low level, respectively. During the sensing node precharge operation, the node QS may be set to a logic low level.

The main latch 134 may include a plurality of NMOS transistors N12 to N16 and inverters IV3 and IV4.

The inverters IV3 and IV4 may be connected in parallel in a reverse direction between a node QM and a node QM_N to configure a latch.

The NMOS transistor N12 and the NMOS transistor N13 are connected in series between the sensing node SO and the ground power VSS, the NMOS transistor N12 is turned on in response to the transmission signal TRANM, and the NMOS transistor N13 is turned on or off according to a potential level of the node QM.

The NMOS transistor N14 is connected between the node QM and a node ND4, and the NMOS transistor N14 is turned on or off in response to a reset signal MRST. The NMOS transistor N15 is connected between the node QM_N and the node ND4 to electrically connect the node QM_N and the node ND4 in response to a set signal MSET. The NMOS transistor N16 is connected between the node ND4 and the ground power VSS, and connects the node ND4 and the ground power VSS according to the potential of the sensing node SO.

Figure 7:
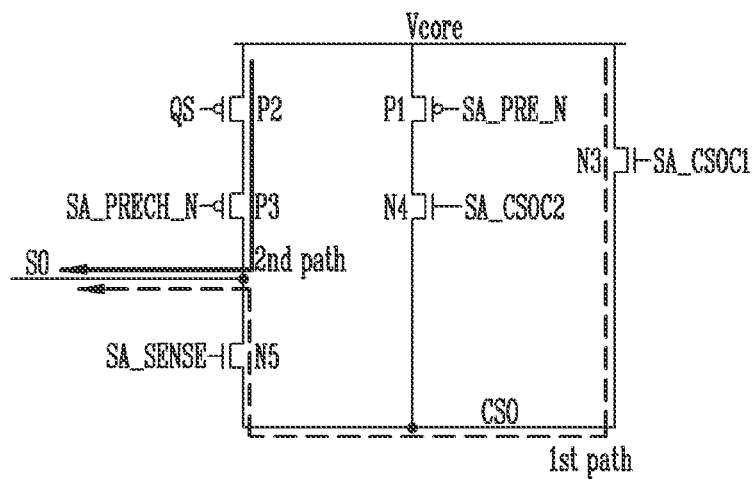
FIG. 7 is a diagram illustrating first and second current paths of the page buffer according to an embodiment of the present disclosure.

FIG. 7 is a diagram illustrating the first and second current paths of the page buffer according to an embodiment of the present disclosure.

Referring to FIG. 7, during the sensing node precharge operation, the bit line controller 131 of FIG. 6 may precharge the sensing node SO to the setting level using the first current path 1st path and the second current path 2nd path.

For example, during the sensing node precharge operation, the sensing node SO may first be first precharged to the first potential level using the first current path 1st path, and then the sensing node SO may be second precharged to the second potential level which is higher than the first potential level using the first and second current paths together. The first potential level may be a level decreased from the core voltage Vcore by the threshold voltage Vth of the NMOS transistor N3, and the second potential level may be the potential level of the core voltage Vcore.

Figure 8:
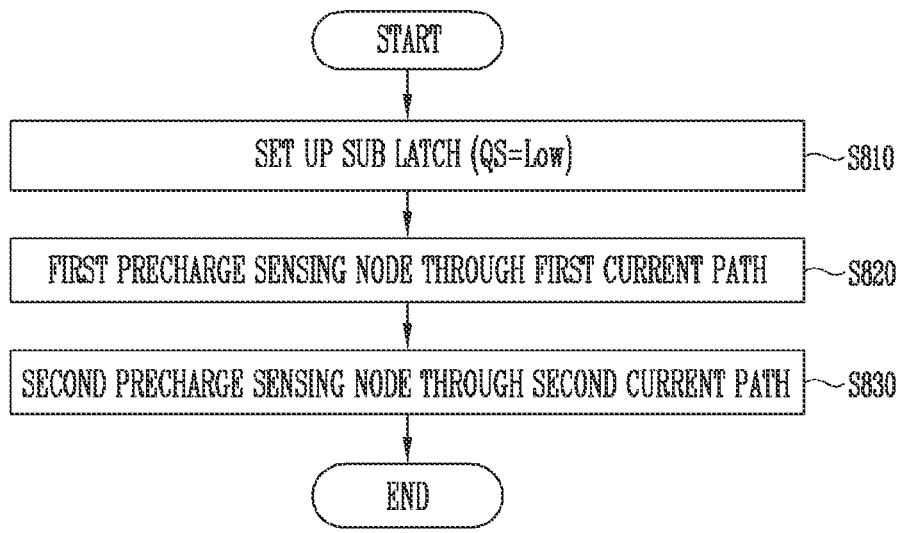
FIG. 8 is a flowchart illustrating a sensing node precharge operation of the page buffer according to an embodiment of the present disclosure.

FIG. 8 is a flowchart illustrating the sensing node precharge operation of the page buffer according to an embodiment of the present disclosure.

Figure 9:
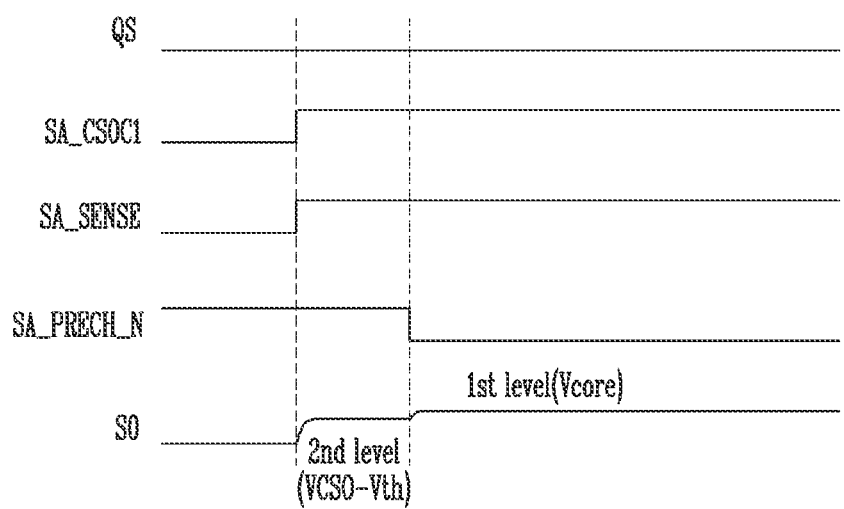
FIG. 9 is a waveform diagram of signals illustrating the sensing node precharge operation of the page buffer according to an embodiment of the present disclosure.

FIG. 9 is a waveform diagram of signals illustrating the sensing node precharge operation of the page buffer according to an embodiment of the present disclosure.

The sensing node precharge operation of the page buffer according to an embodiment of the present disclosure is described with reference to FIGS. 6 to 9 as follows.

In an embodiment of the present disclosure, an operation of one page buffer is described as an example, but the plurality of page buffers PB1 to PBm included in the read and write circuit 130 shown in FIG. 2 may perform the sensing node precharge operation simultaneously or during some overlapping time. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

In step S810, during the sensing node precharge operation, the node QS of the sub latch 133 is preset to a logic low level Low. For example, the PMOS transistor is turned on in response to the signal of the node QS.

In step S820, the bit line controller 131 may perform a first precharge of which includes precharging the sensing node SO to the first potential level VCSO-Vth by forming the first current path 1st path. For example, the NMOS transistor N3 applies the core voltage Vcore to the common sensing node CSO in response to the first common sensing control signal SA_CSOC1 of a logic high level. Accordingly, the common sensing node CSO is precharged to the setting level VCSO. The NMOS transistor N5 forms the first current path 1st path by electrically connecting the common sensing node CSO and the sensing node SO in response to the sensing signal SA_SENSE. Accordingly, the sensing node SO is precharged to the first potential level VCSO-Vth or second level '$2^{nd}$ level' as shown in FIG. 9.

In step S830, the bit line controller 131 may perform a second precharge of which includes precharging the sensing node SO to the second potential level Vcore by additionally forming the second current path 2nd path. For example, the PMOS transistor P3 is turned on in response to the second precharge signal SA_PRECH_N. Accordingly, the second current path connected to the sensing node SO through the PMOS transistor P2 and the PMOS transistor P3 from the core voltage Vcore is formed, and the sensing node SO is precharged to the second potential level Vcore or first level '$1^{st}$ level' as shown in FIG. 9. In an embodiment, the second potential level Vcore is higher than the first potential level VCSO-Vth. In an embodiment, the first and second current paths may be simultaneously formed to precharge the sensing node SO to the second potential level Vcore.

As described above, according to an embodiment of the present disclosure, during the precharge operation of the sensing node of the page buffer, the sensing node SO may first be first precharged to the first potential level by using the first current path, and then the sensing node SO may be second precharged to the second potential level higher than the first potential level by additionally forming the second current path. That is, during the sensing node precharge operation of the plurality of page buffers, a phenomenon in which the core voltage is dropped may be improved by gradually precharging the sensing node.

Figure 10:
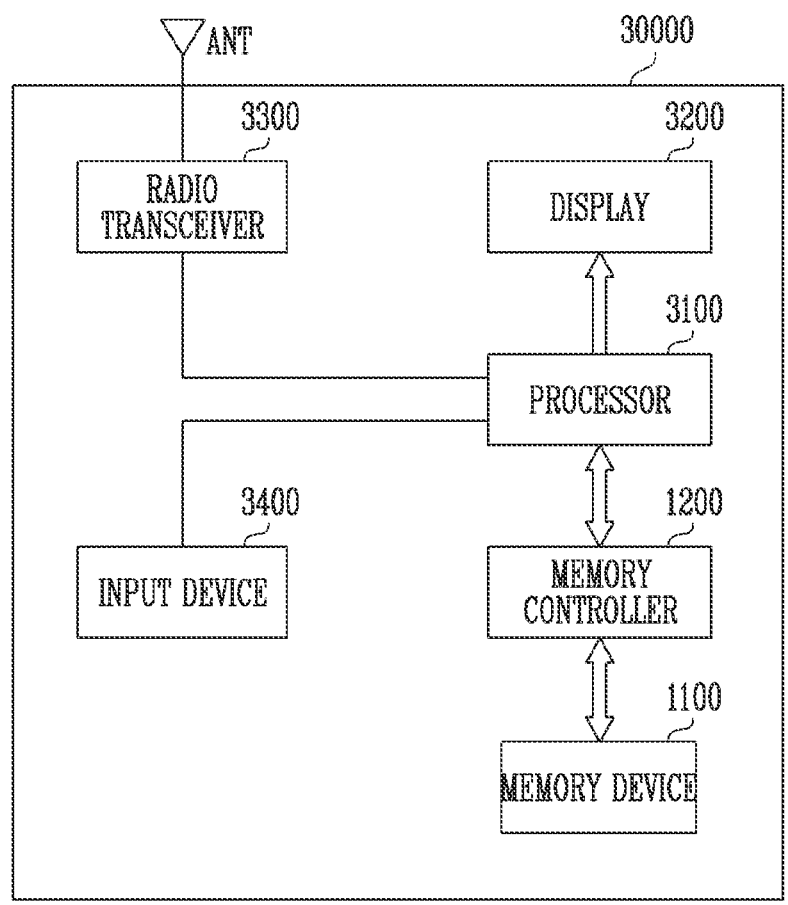
FIG. 10 is a diagram illustrating an embodiment of the memory system.

FIG. 10 is a diagram illustrating an embodiment of the memory system.

Referring to FIG. 10, a memory system 30000 may be implemented as a cellular phone, a smart phone, a tablet PC, a personal digital assistant (PDA) or a wireless communication device. The memory system 30000 may include the memory device 1100 and the memory controller 1200 capable of controlling the operation of the memory device 1100. The controller 1200 may control a data access operation, for example, a program operation, an erase operation, or a read operation, of the memory device 1100 under control of a processor 3100.

Data programmed in the memory device 1100 may be output through a display 3200 under the control of the memory controller 1200.

A radio transceiver 3300 may transmit and receive a radio signal through an antenna ANT. For example, the radio transceiver 3300 may convert a radio signal received through the antenna ANT into a signal that may be processed by the processor 3100. Therefore, the processor 3100 may process the signal output from the radio transceiver 3300 and transmit the processed signal to the memory controller 1200 or the display 3200. The memory controller 1200 may program the signal processed by the processor 3100 to the memory device 1100. In addition, the radio transceiver 3300 may convert a signal output from the processor 3100 into a radio signal, and output the converted radio signal to an external device through the antenna ANT. An input device 3400 may be a device capable of inputting a control signal for controlling the operation of the processor 3100 or data to be processed by the processor 3100. The input device 3400 may be implemented as a pointing device such as a touch pad or a computer mouse, a keypad, or a keyboard. The processor 3100 may control an operation of the display 3200 so that data output from the memory controller 1200, data output from the radio transceiver 3300, or data output from the input device 3400 is output through the display 3200.

According to an embodiment, the memory controller 1200 capable of controlling the operation of memory device 1100 may be implemented as a part of the processor 3100 and may also be implemented as a chip separate from the processor 3100. In addition, the memory controller 1200 may be implemented through the examples of the controller 1200 shown in FIG. 1.

Figure 11:
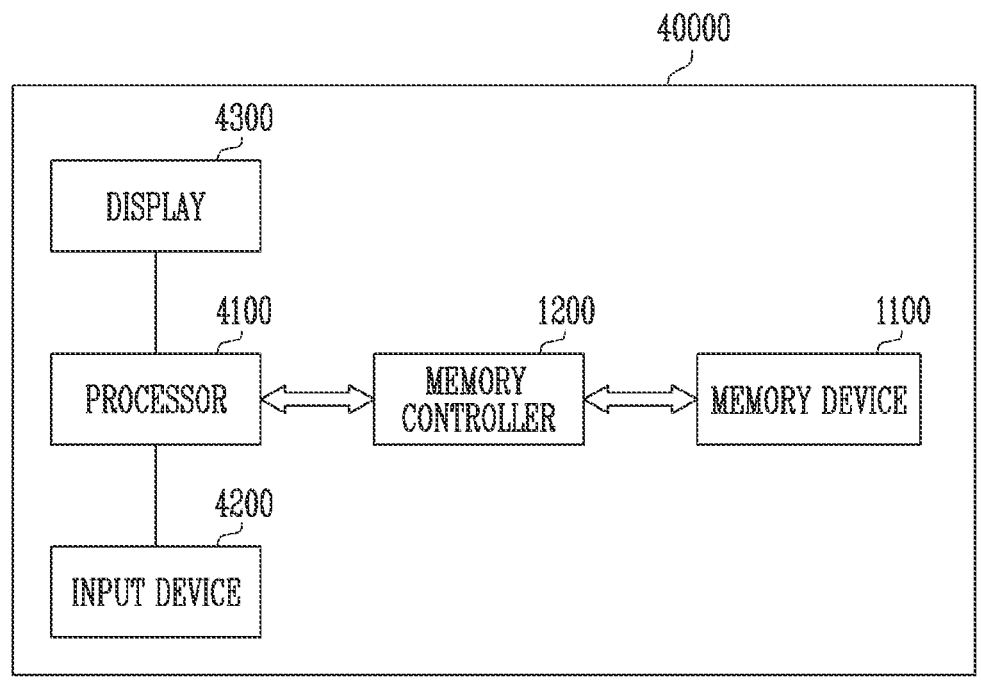
FIG. 11 is a diagram illustrating an embodiment of the memory system.

FIG. 11 is a diagram illustrating another example of the memory system.

Referring to FIG. 11, a memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 capable of controlling a data process operation of the storage device 1100.

A processor 4100 may output data stored in the memory device 1100 through a display 4300, according to data input through an input device 4200. For example, the input device 4200 may be implemented as a point device such as a touch pad or a computer mouse, a keypad, or a keyboard.

The processor 4100 may control the overall operation of the memory system 40000 and control the operation of the memory controller 1200. According to an embodiment, the memory controller 1200 capable of controlling the operation of memory device 1100 may be implemented as a part of the processor 4100 or may be implemented as a chip separate from the processor 4100. In addition, the memory controller 1200 may be implemented through the examples of the controller 1200 shown in FIG. 1.

Figure 12:
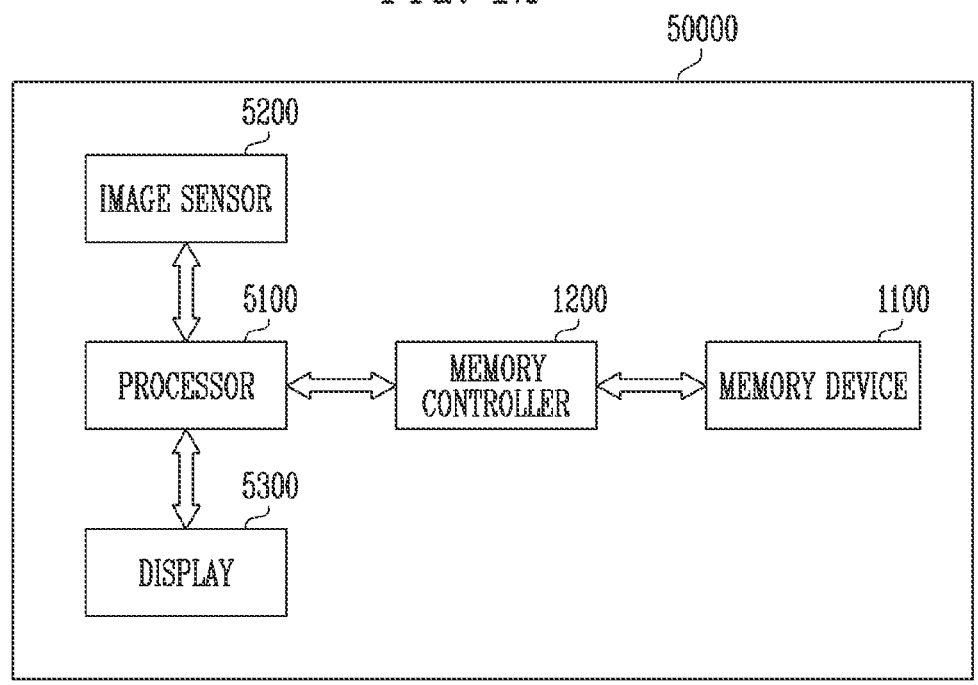
FIG. 12 is a diagram illustrating an embodiment of the memory system.

FIG. 12 is a diagram illustrating an embodiment of the memory system.

Referring to FIG. 12, a memory system 50000 may be implemented as an image processing device, for example, a digital camera, a portable phone provided with a digital camera, a smart phone provided with a digital camera, or a tablet PC provided with a digital camera.

The memory system 50000 includes the memory device 1100 and the memory controller 1200 capable of controlling a data process operation, for example, a program operation, an erase operation, or a read operation, of the memory device 1100.

An image sensor 5200 of the memory system 50000 may convert an optical image into digital signals. The converted digital signals may be transmitted to a processor 5100 or the memory controller 1200. Under control of the processor 5100, the converted digital signals may be output through a display 5300 or stored in the memory device 1100 through the controller 1200. In addition, data stored in the memory device 1100 may be output through the display 5300 under the control of the processor 5100 or the memory controller 1200.

According to an embodiment, the memory controller 1200 capable of controlling the operation of memory device 1100 may be implemented as a part of the processor 5100 or may be implemented as a chip separate from the processor 5100. In addition, the memory controller 1200 may be implemented through the examples of the controller 1200 shown in FIG. 1.

Figure 13:
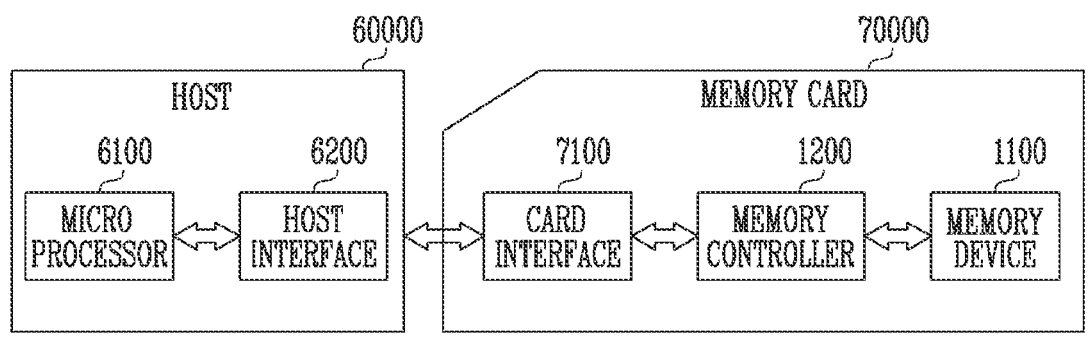
FIG. 13 is a diagram illustrating an embodiment of the memory system.

FIG. 13 is a diagram illustrating an embodiment of the memory system.

Referring to FIG. 13, a memory system 70000 may be implemented as a memory card or a smart card. The memory system 70000 may include the memory device 1100, the memory controller 1200, and a card interface 7100.

The memory controller 1200 may control data exchange between the memory device 1100 and the card interface 7100. According to an embodiment, the card interface 7100 may be a secure digital (SD) card interface or a multi-media card (MMC) interface, but is not limited thereto. In addition, the memory controller 1200 may be implemented through the examples of the controller 1200 shown in FIG. 1.

The card interface 7100 may interface data exchange between a host 60000 and the controller 1200 according to a protocol of the host 60000. According to an embodiment, the card interface 7100 may support a universal serial bus (USB) protocol, and an interchip (IC)-USB protocol. Here, the card interface may refer to hardware capable of supporting a protocol that is used by the host 60000, software installed in the hardware, or a signal transmission method.

When the memory system 70000 is connected to a host interface 6200 of the host 60000 such as a PC, a tablet PC, a digital camera, a digital audio player, a mobile phone, a console video game hardware, or a digital set-top box, the host interface 6200 may perform data communication with the memory device 1100 through the card interface 7100 and the memory controller 1200 under control of a microprocessor 6100.

Although the present disclosure has been described with reference to the embodiments and drawings, the present disclosure is not limited to the embodiments described above, and various changes and modifications may be made from the disclosed description by those skilled in the art to which the present disclosure pertains.

What is claimed is:

1. A page buffer comprising:
   a sensing node;
   a bit line controller connected between the sensing node and a bit line, and configured to, during a sensing node precharge operation, perform a first precharge of the sensing node to precharge the sensing node to a first potential level and then perform a second precharge of the sensing node to a second potential level; and
   a sub latch for latching sensing data based on a potential level of the sensing node.

2. The page buffer of claim 1, wherein the bit line controller first precharges the sensing node by forming a first current path and then second precharges the sensing node by forming a second current path during the sensing node precharge operation.

3. The page buffer of claim 1, wherein the first potential level is lower than the second potential level.

4. The page buffer of claim 1, wherein the bit line controller comprises:
   a first transistor connected between a core voltage and a common sensing node and turned on in response to a first common sensing control signal;
   a second transistor connected between the common sensing node and the sensing node and turned on in response to a sensing signal; and
   third and fourth transistors connected in series between the core voltage and the sensing node.

5. The page buffer of claim 4, wherein the third transistor is turned on in response to a potential of a node of the sub latch, and the fourth transistor is turned on in response to a precharge signal.

6. The page buffer of claim 4, wherein the first and second transistors are NMOS transistors, and the third and fourth transistors are PMOS transistors.

7. The page buffer of claim 6, wherein a first current path is formed through the first transistor and the second transistor, and
   a second current path is formed through the third transistor and the fourth transistor.

8. The page buffer of claim 1, wherein the first and second precharges are performed simultaneously to increase the potential level of the sensing node to the second potential level.

9. A semiconductor memory device comprising:
   a memory cell array; and
   a plurality of page buffers connected to a plurality of bit lines of the memory cell array, respectively,
   wherein each of the plurality of page buffers comprises:
   a sensing node;
   a bit line controller connected between the sensing node and a bit line, and configured to, during a sensing node precharge operation, perform a first precharge of the sensing node to precharge the sensing node to a first potential level and then perform a second precharge of the sensing node to increase a potential level of the sensing node to a second potential level; and
   a sub latch for latching sensing data based on a potential level of the sensing node.

10. The semiconductor memory device of claim 9, wherein the bit line controller first precharges the sensing node by forming a first current path and then second precharges the sensing node by forming a second current path during the sensing node precharge operation.

11. The semiconductor memory device of claim 9, wherein the first potential level is lower than the second potential level.

12. The semiconductor memory device of claim 9, wherein the bit line controller comprises:
   a first transistor connected between a core voltage and a common sensing node and turned on in response to a first common sensing control signal;
   a second transistor connected between the common sensing node and the sensing node and turned on in response to a sensing signal; and
   third and fourth transistors connected in series between the core voltage and the sensing node.

13. The semiconductor memory device of claim 12, wherein the third transistor is turned on in response to a potential of a node of the sub latch, and the fourth transistor is turned on in response to a precharge signal.

14. The semiconductor memory device of claim 12, wherein the first and second transistors are NMOS transistors, and the third and fourth transistors are PMOS transistors.

15. The semiconductor memory device of claim 14, wherein a first current path is formed through the first transistor and the second transistor, and
   a second current path is formed through the third transistor and the fourth transistor.

16. A page buffer comprising:
   a sensing node;
   a bit line controller connected between the sensing node and a bit line, and configured to, during a sensing node precharge operation, precharge the sensing node to a first potential level using a first current path, and, after the sensing node has been precharged to the first potential level using the first current path, precharging the sensing node to a second potential level using a second current path; and
   a sub latch for latching sensing data based on a potential level of the sensing node.

17. The page buffer of claim 16, wherein the second potential level is higher than the first potential level.

18. The page buffer of claim 16, wherein the bit line controller comprises:
   a first transistor connected between a core voltage and a common sensing node and turned on in response to a first common sensing control signal;
   a second transistor connected between the common sensing node and the sensing node and turned on in response to a sensing signal; and
   third and fourth transistors connected in series between the core voltage and the sensing node.

19. The page buffer of claim 18, wherein the third transistor is turned on in response to a potential of a node of the sub latch, and the fourth transistor is turned on in response to a precharge signal.

20. The page buffer of claim 18, wherein the first and second transistors are NMOS transistors, and the third and fourth transistors are PMOS transistors.

21. The page buffer of claim 20, wherein the first current path is formed through the first transistor and the second transistor, and the second current path is formed through the third transistor and the fourth transistor.

* * * * *